US009337809B2

(12) United States Patent
Takemura

(10) Patent No.: US 9,337,809 B2
(45) Date of Patent: May 10, 2016

(54) SEMICONDUCTOR INTEGRATED CIRCUIT, INFORMATION PROCESSING DEVICE AND IMAGE FORMING APPARATUS

(71) Applicant: KYOCERA Document Solutions Inc., Osaka-shi, Osaka (JP)

(72) Inventor: Masataka Takemura, Osaka (JP)

(73) Assignee: KYOCERA Document Solutions inc., Osaka (JP)

( * ) Notice: Subject to any disclaimer, the term of this patent is extended or adjusted under 35 U.S.C. 154(b) by 88 days.

(21) Appl. No.: 14/230,526

(22) Filed: Mar. 31, 2014

(65) Prior Publication Data

US 2014/0292391 A1 Oct. 2, 2014

(30) Foreign Application Priority Data

Mar. 29, 2013 (JP) .................................. 2013-071098

(51) Int. Cl.
*H03K 3/00* (2006.01)
*H03K 3/013* (2006.01)
(52) U.S. Cl.
CPC ...................................... *H03K 3/013* (2013.01)
(58) Field of Classification Search
CPC ........ G06F 1/06; H03L 7/0812; H03L 7/0337
See application file for complete search history.

(56) References Cited

U.S. PATENT DOCUMENTS

2001/0026179 A1* 10/2001 Saeki ..................... H03K 5/131
327/147

FOREIGN PATENT DOCUMENTS

| JP | 10-31528 | 2/1998 |
| JP | 2002073199 | 3/2002 |
| JP | 2004-192202 | 7/2004 |

OTHER PUBLICATIONS

Japanese Patent Appl. No. 2013-071098—Office Action issued Jun. 23, 2015.

* cited by examiner

*Primary Examiner* — Sibin Chen
(74) *Attorney, Agent, or Firm* — Gerald E. Hespos; Michael J. Porco; Matthew T. Hespos

(57) ABSTRACT

A semiconductor integrated circuit includes an identification information storage, an intermediate clock generator and an operating clock generator. The identification information storage stores identification information of the semiconductor integrated circuit. The intermediate clock generator generates an intermediate clock having a frequency higher than that of a reference clock using the reference clock input to the semiconductor integrated circuit from the outside of the semiconductor integrated circuit. The operating clock generator generates the operating clock having a frequency higher than that of the reference clock and lower than that of the intermediate clock in synchronization with a timing allotted according to the identification information stored in the identification information storage, using the intermediate clock.

9 Claims, 8 Drawing Sheets

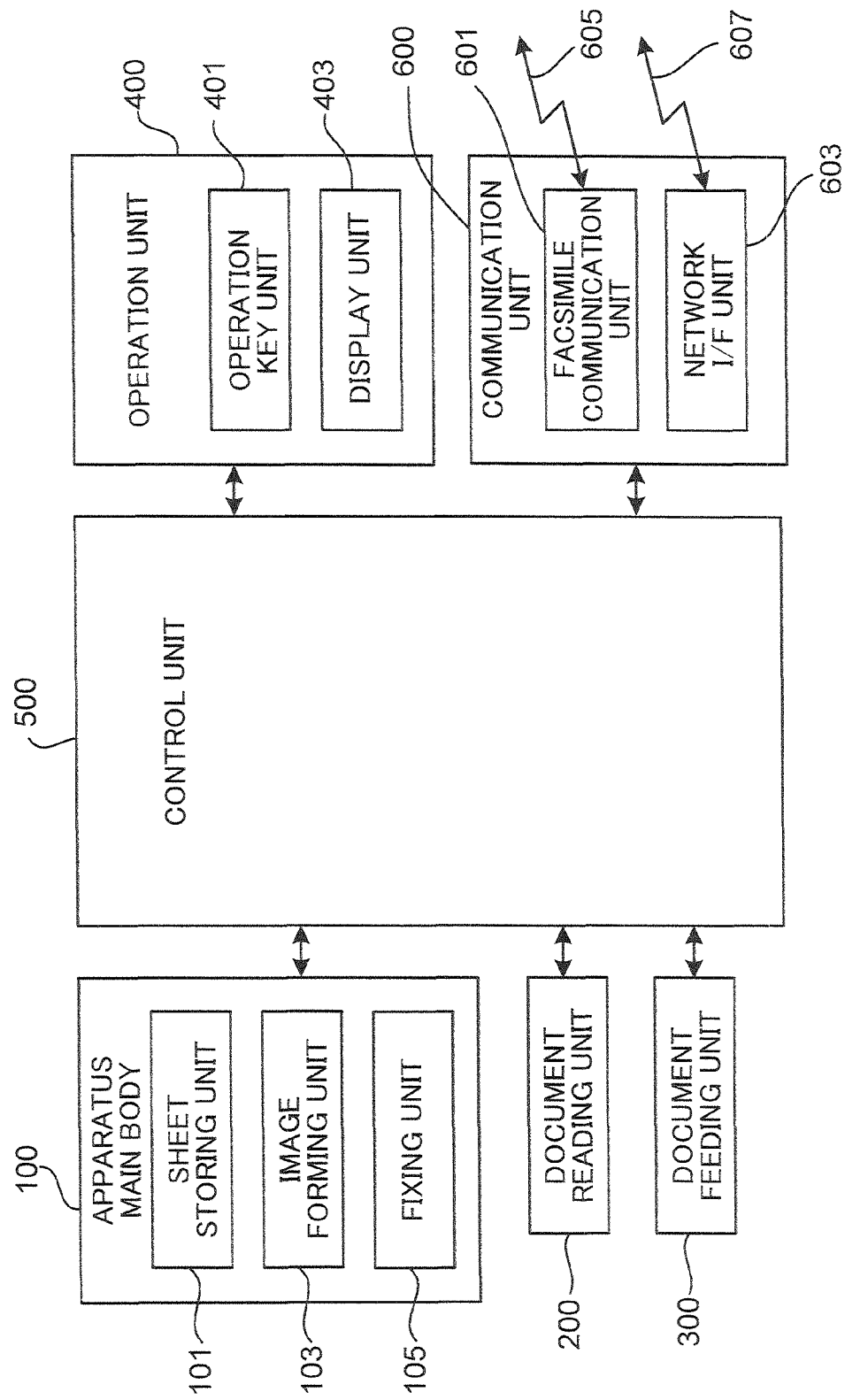

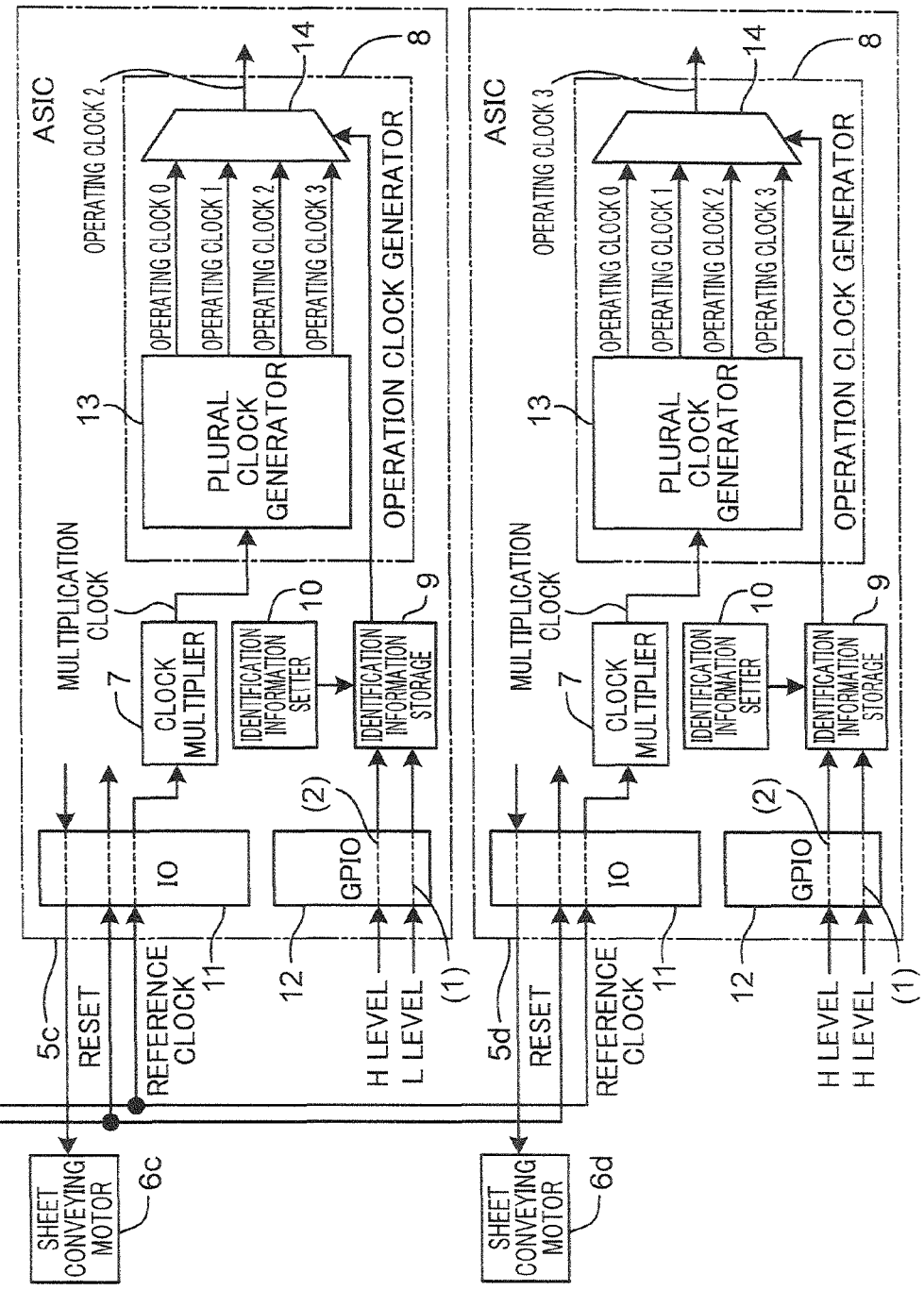

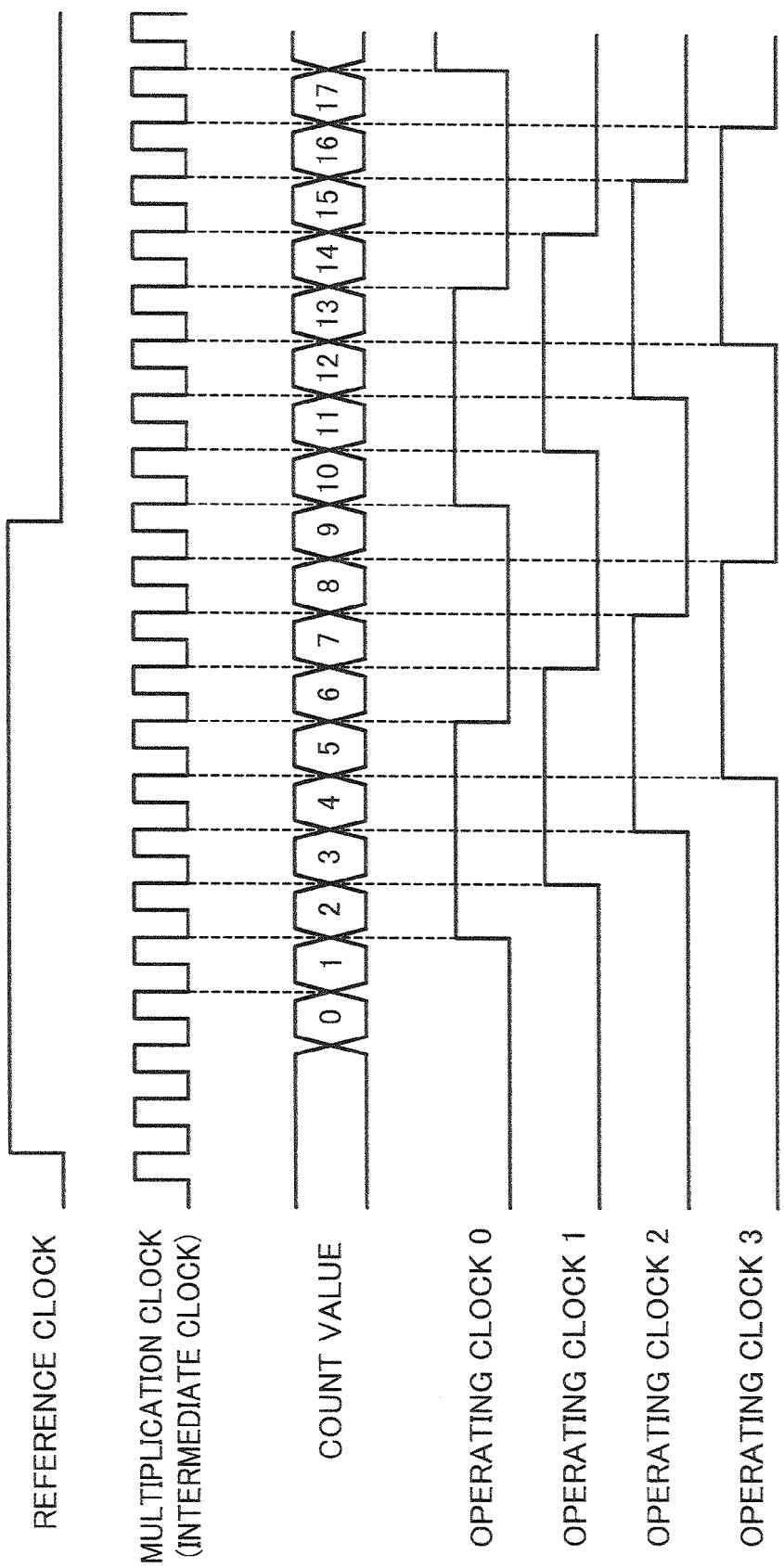

SEMICONDUCTOR INTEGRATED CIRCUIT, INFORMATION PROCESSING DEVICE AND IMAGE FORMING APPARATUS

This application is based on Japanese Patent Application No. 2013-71098 filed with the Japan Patent Office on Mar. 29, 2013, the contents of which are hereby incorporated by reference.

BACKGROUND

The present disclosure relates to a semiconductor integrated circuit, an information processing device and an image forming apparatus and particularly to a technique to address unnecessary radiation.

Electromagnetic interference (EMI) is a phenomenon in which a trouble (e.g. malfunction) occurs in an electronic device due to electromagnetic waves radiated from the device called unnecessary radiation. A level of unnecessary radiation is determined by standards such as IEC (international Electrotechnical Commission) standards and CISPR (Comité International Spécial des Perturbations Radioélectriques) standards.

The following technique has been proposed as a technique to address unnecessary radiation. In a semiconductor integrated circuit with a plurality of circuit blocks and delay elements provided in a plurality of stages through which clocks for operating these circuit blocks are passed, timings of clocks to be supplied to a plurality of circuit blocks are made different from each other by making the number of the delay elements, through which the clock passes, different depending on the circuit block.

The above conventional technique uses the delay elements and has the following problem. In the delay element, a delay time cannot have a fixed value due to variations in the operating temperature of the semiconductor integrated circuit and semiconductor processes at the time of manufacturing the semiconductor integrated circuit. Thus, a level of unnecessary radiation differs in each semiconductor integrated circuit. Some of semiconductor integrated circuits have a level of unnecessary radiation exceeding a standard value. Further, in the case of making timings of clocks to be supplied to a plurality of circuit blocks largely different, delay elements provided in a multitude of stages are necessary. Thus, a circuit size becomes larger.

The above conventional technique is a technique for suppressing a level of unnecessary radiation in one semiconductor integrated circuit (one IC chip) and does not consider the suppression of the level of unnecessary radiation in all semiconductor integrated circuits if an information processing device includes a plurality of semiconductor integrated circuits (a plurality of IC chips).

The present disclosure aims to provide a semiconductor integrated circuit, an information processing device and an image forming apparatus capable of suppressing a level of unnecessary radiation in all of a plurality of semiconductor integrated circuits.

SUMMARY

A semiconductor integrated circuit according to one aspect of the present disclosure is a semiconductor integrated circuit capable of generating an operating clock and includes an identification information storage, an intermediate clock generator and an operating clock generator. The identification information storage stores identification information of the semiconductor integrated circuit. The intermediate clock generator generates an intermediate clock having a frequency higher than that of a reference clock using the reference clock input to the semiconductor integrated circuit from the outside of the semiconductor integrated circuit. The operating clock generator generates the operating clock having a frequency higher than that of the reference clock and lower than that of the intermediate clock in synchronization with a timing allotted according to the identification information stored in the identification information storage, using the intermediate clock.

An information processing device according to another aspect of the present disclosure includes a plurality of the semiconductor integrated circuits distinguished from each other according to the identification information, and the operating clock generators provided in the plurality of semiconductor integrated circuits generate the operating clocks at timings different from each other.

An image forming apparatus according to yet another aspect of the present disclosure includes the above information processing device and a plurality of loads used to control the image forming apparatus, respectively connected to the plurality of semiconductor integrated circuits and having the same configuration.

These and other objects, features and advantages of the present disclosure will become more apparent upon reading the following detailed description along with the accompanying drawings.

BRIEF DESCRIPTION OF THE DRAWINGS

FIG. 2 is a block diagram showing the configuration of the image forming apparatus shown in FIG. 1, FIG. 3B is a block diagram showing the configuration of the information processing device provided in the image forming apparatus according to the embodiment, FIG. 5 is a time chart showing a plurality of operating clocks generated by a plural clock generator.

DETAILED DESCRIPTION

Figure 1:
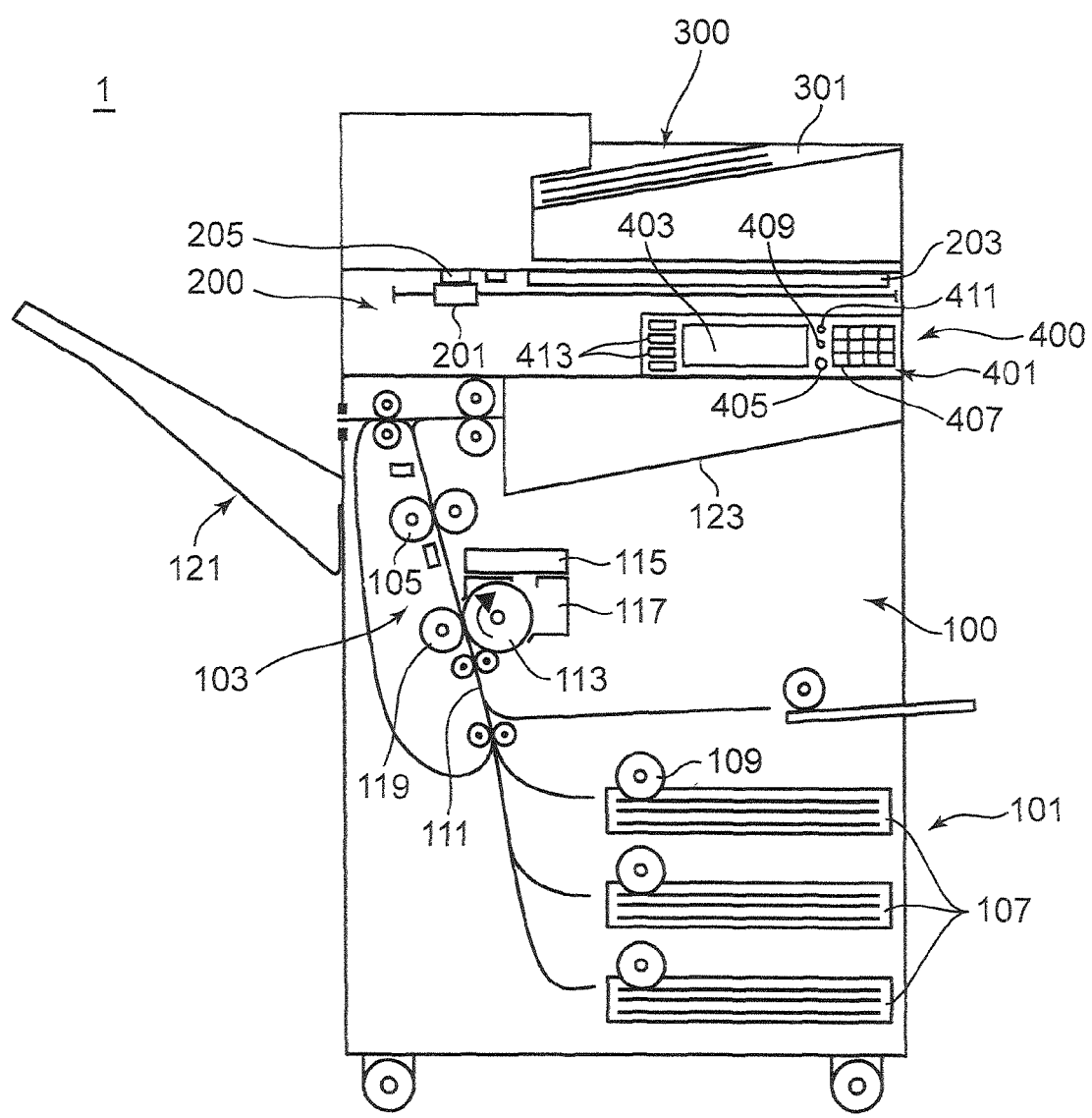
FIG. 1 is a diagram schematically showing an internal structure of an image forming apparatus according to an embodiment.

Hereinafter, an embodiment of the present disclosure is described based on the drawings. FIG. 1 is a diagram schematically showing an internal structure of an image forming apparatus 1 according to one embodiment of the present disclosure. The image forming apparatus 1 can be, for example, applied to a digital complex machine having copier, printer, scanner and facsimile functions. The image forming apparatus 1 includes an apparatus main body 100, a document reading unit 200 arranged atop the apparatus main body 100, a document feeding unit 300 arranged atop the document reading unit 200 and an operation unit 400 arranged on the front surface of an upper part of the apparatus main body 100.

The document feeding unit 300 functions as an automatic document feeder and can successively feed a plurality of documents placed on a document placing portion 301 so that the documents can be read by the document reading unit 200.

The document reading unit 200 includes a carriage 201 carrying an exposure lamp and the like, a document platen 203 made of a transparent material such as glass, an unillustrated CCD (Charge Coupled Device) sensor and a document reading slit 205. In the case of reading a document placed on the document platen 203, the document is read by the CCD sensor while the carriage 201 is moved in a longitudinal direction of the document platen 203. Contrary to this, in the case of reading a document fed from the document feeding unit 300, the carriage 201 is moved to a position facing the document reading slit 205 and the document fed from the document feeding unit 300 is read by the CCD sensor through the document reading slit 205. The CCD sensor outputs an image of the read document as image data.

The apparatus main body 100 includes a sheet storing unit 101, an image forming unit 103 and a fixing unit 105. The sheet storing unit 101 is arranged in a lowest part of the apparatus main body 100 and includes sheet cassettes 107 capable of storing a stack of sheets. The uppermost sheet of the stack of sheets stored in the sheet cassette 107 is fed to a sheet conveyance path 111 by driving a pickup roller 109. The sheet is conveyed to the image forming unit 103 through the sheet conveyance path 111.

The image forming unit 103 forms a toner image on a sheet conveyed thereto. The image forming unit 103 includes a photoconductive drum 113, an exposure unit 115, a developing unit 117 and a transfer unit 119. The exposure unit 115 generates light modulated in accordance with image data (image output from the document reading unit 200, image data transmitted from a personal computer, facsimile-received image data or the like) and irradiates the light to the peripheral surface of the uniformly charged photoconductive drum 113. This causes an electrostatic latent image corresponding to the image data to be formed on the peripheral surface of the photoconductive drum 113. In this state, toner is supplied from the developing unit 117 to the peripheral surface of the photoconductive drum 113, whereby a toner image corresponding to the image data is formed on the peripheral surface. This toner image is transferred to a sheet conveyed from the sheet storing unit 101 described above by the transfer unit 119.

The sheet having the toner image transferred thereto is conveyed to the fixing unit 105. In the fixing unit 105, heat and pressure are applied to the toner image and the sheet to fix the toner image to the sheet. The sheet is discharged to a stack tray 121 or a sheet discharge tray 123.

The operation unit 400 includes an operation key unit 401 and a display unit 403. The display unit 403 has a touch panel function and displays a screen including soft keys. A user makes settings necessary to perform the function such as a copy function by operating the soft keys while viewing the screen.

The operation key unit 401 includes operation keys which are hard keys, specifically a start key 405, a numerical keypad 407, a stop key 409, a reset key 411, function changeover keys 413 for switching the function among copier, printer, scanner and facsimile functions and the like.

The start key 405 is a key for starting an operation such as copying or facsimile transmission. The numerical keypad 407 is a keypad for entering numbers such as the number of copies and facsimile numbers. The stop key 409 is a key for stopping a copying operation and the like on the way. The reset key 411 is a key for returning the set content to an initial setting state.

The function changeover keys 413 are keys including a copy key, a transmit key and the like and configured to switch a copy function, a transmit function and the like from one to another. If the copy key is operated, an initial screen for copying is displayed on the display unit 403. If the transmit key is operated, an initial screen for facsimile transmission and mail transmission is displayed on the display unit 403.

FIG. 2 is a block diagram showing the configuration of the image forming apparatus 1 shown in FIG. 1. The image forming apparatus 1 is so configured that the document reading unit 200, the document feeding unit 300, the operation unit 400, a control unit 500 and a communication unit 600 are connected to each other by a bus. The apparatus main body 100, the document reading unit 200, the document feeding unit 300 and the operation unit 400 are not described here since being already described.

The control unit 500 includes a CPU (Central Processing Unit), a ROM (Read Only Memory), a RAM (Random Access Memory), an image memory and the like. The CPU executes a control necessary to operate the image forming apparatus 1 on the above constituent elements of the image forming apparatus 1. The ROM stores software necessary to control the operation of the image forming apparatus 1. The RAM is used such as to temporarily store data generated during the execution of the software and store application software. The image memory temporarily stores image data (image output from the document reading unit 200, image data transmitted from a personal computer, facsimile-received image data or the like).

The communication unit 600 includes a facsimile communication unit 601 and a network I/F unit 603. The facsimile communication unit 601 includes an NCU (Network Control Unit) for controlling a telephone line connection with a destination facsimile machine and a modulation/demodulation circuit for modulating/demodulating a signal for facsimile communication. The facsimile communication unit 601 is connected to a telephone line 605.

The network I/F unit 601 is connected to a LAN (Local Area Network) 607. The network I/F unit 603 is a communication interface circuit for carrying out communication with terminal units such as personal computers connected to the LAN 607.

Figure 3A:
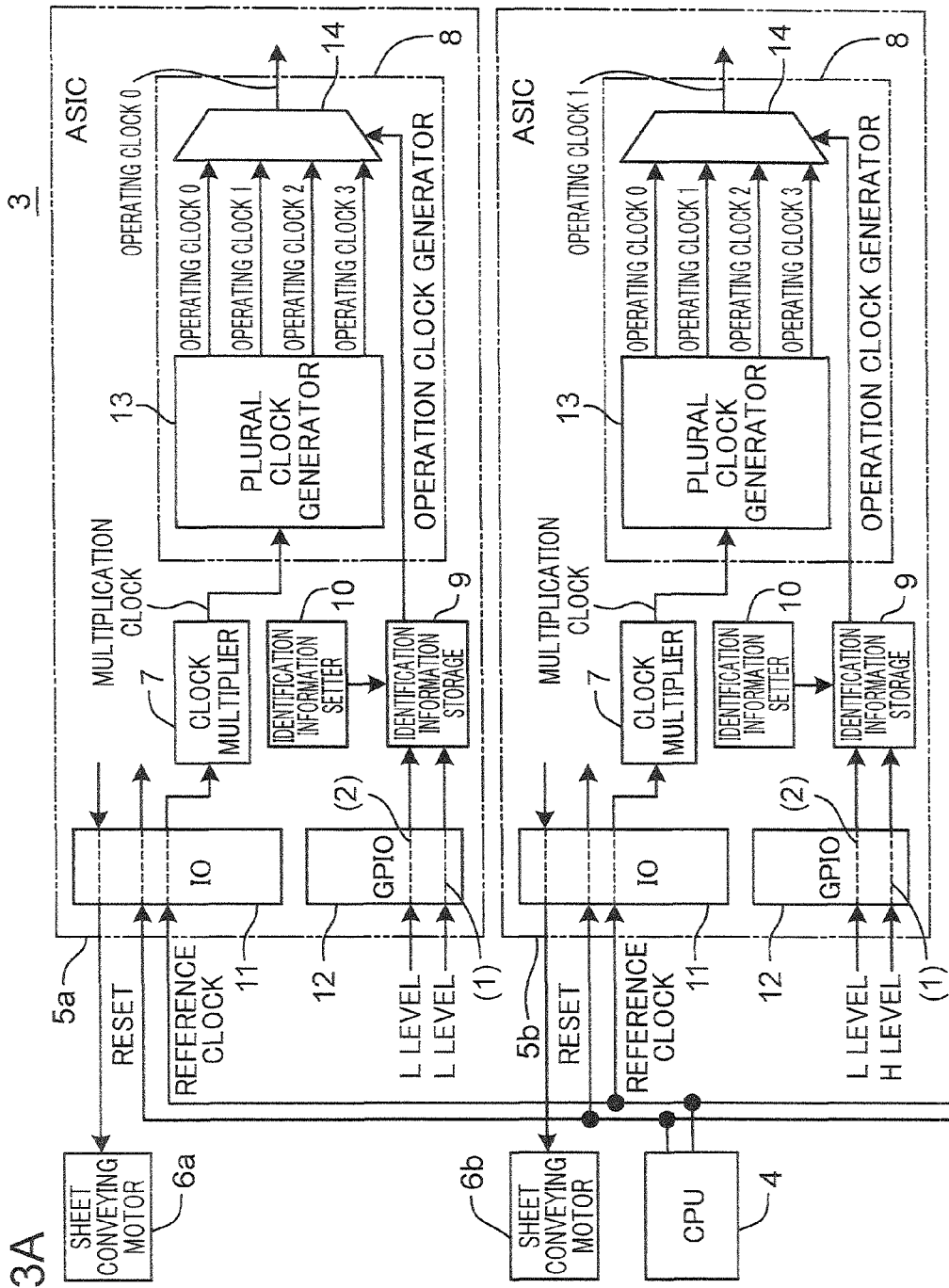
FIG. 3A is a block diagram showing the configuration of an information processing device provided in the image forming apparatus according to the embodiment.

FIGS. 3A and 3B are block diagrams showing the configuration of an information processing device 3 provided in the image forming apparatus 1 according to this embodiment. Paths for sending a reset signal of FIGS. 3A and 3B are connected at a position (a). Paths for sending a reference clock signal of FIGS. 3B and 3A are connected at a position (b). The information processing device 3 includes a CPU 4 and four IC chips 5a, 5b, 5c and 5d. Unless it is necessary to distinguish the IC chips 5a, 5b, 5c and 5d from each other, they are written as the IC chips 5. Each IC chip functions as a semiconductor integrated circuit.

The information processing device 3 controls four sheet conveying motors 6a, 6b, 6c and 6d. Unless it is necessary to distinguish the sheet conveying motor 6a, 6b, 6c and 6d from each other, they are written as the sheet conveying motors 6.

The four sheet conveying motors 6 are motors for driving a plurality of sheet conveying rollers (not shown) arranged in the sheet conveyance path 111 of FIG. 1. The four sheet conveying motors 6 have the same configuration. The four sheet conveying motors 6 convey a sheet along the sheet conveyance path 111 by respectively rotating the plurality of sheet conveying rollers.

The CPU 4 is included in the control unit 500 of FIG. 2 and functions as a master.

The four IC chips 5 are respectively ASICs (Application Specific Integrated Circuits) which are included in the control unit 500 of FIG. 2 and function as slaves. The four IC chips 5 have the same configuration.

The image forming apparatus 1 includes a plurality of loads having the same configuration such as the sheet conveying motors 6 or sheet detection sensors (not shown). If the plurality of loads having the same configuration are processed by one IC chip 5, an IC chip with a large number of terminals (e.g. IC chip with 200 terminals) is necessary, which increases cost. Accordingly, to reduce IC chip cost, the plurality of loads having the same configuration are processed using a plurality of IC chips with a small number of terminals (four IC chips 5 with 50 terminals having the same configuration) in this embodiment.

Although an example with four IC chips 5 is described, the number of the IC chips 5 is not limited to four. Further, although an example of controlling one sheet conveying motor 6 by one IC chip 5 is described, a plurality of sheet conveying motors 6 may be controlled by one IC chip 5.

Since the four IC chips 5 have the same configuration, the configuration of the IC chip 5 is described, taking the IC chip 5a as an example. The IC chip 5a includes a clock multiplier 7, an operation clock generator 8, an identification information storage 9, an identification information setter 10, an input/output port 11 and a general purpose input/output port 12.

The clock multiplier 7 is a PLL (Phase Locked Loop) multiplication circuit and generates a multiplication clock by multiplying the frequency of a reference clock output from the CPU 4, using the reference clock. In this way, the clock multiplier 7 functions as an intermediate clock generator for generating an intermediate clock having a frequency higher than that of the reference clock, using the reference clock input to the IC chip 5a from the outside of the IC chip 5a.

The identification information storage 9 stores identification information of the IC chip 5a. In this embodiment, identification information (00) is allotted to the IC chip 5a, identification information (01) is allotted to the IC chip 5b, identification information (10) is allotted to the IC chip 5c and identification information (11) is allotted to the IC chip 5d.

The operating clock generator 8 generates an operating clock having a frequency higher than that of the reference clock and lower than that of the multiplication clock in synchronization with a timing allotted according to the identification information stored in the identification information storage 9, using the multiplication clock (intermediate clock).

The operating clock generator 8 includes a plural clock generator 13 and an operating clock selector 14. The plural clock generator 13 generates four operating clocks 0, 1, 2 and 3 at timings different from each other. Although the operating clocks 0, 1, 2 and 3 have the same frequency, the phases thereof differ. The operating clock selector 14 selects the operating clock allotted to the identification information stored in the identification information storage 9 out of the four operating clocks 0, 1, 2 and 3 generated by the plural clock generator 13.

In this embodiment, the operating clock 0 is allotted to the identification information (00), the operating clock 1 is allotted to the identification information (01), the operating clock 2 is allotted to the identification information (10) and the operating clock 3 is allotted to the identification information (11). Accordingly, the operating clock 0 is selected in the IC chip 5a, the operating clock 1 is selected in the IC chip 5b, the operating clock 2 is selected in the IC chip 5c and the operating clock 3 is selected in the IC chip 5d.

The input/output port 11 is an interface for external connection of the IC chip 5a and a port from which a control signal to be sent to the sheet conveying motor 6a is output, a port to which the reference clock output from the CPU 4 is input and a port to which a reset signal of the IC chip 5a output from the CPU 4 is input are shown in FIGS. 3A and 3B.

The general purpose input/output port 12 is a port (terminal) called a GPIO (General Purpose Input/Output) and capable of arbitrarily controlling the input and output by software. Signals output from the CPU 4 are input to the general purpose input/output port 12 and signals output from the general purpose input/output port 12 are input to the CPU 4. The general purpose input/output port 12 functions as a signal terminal The general purpose input/output port 12 includes a plurality of ports and, out of them, ports (1) and (2) are fixed at predetermined logic levels. The identification information setter 10 causes the identification information storage 9 to store signals input to the ports (1) and (2) as identification information when the four IC chips 5 are reset, i.e. when a reset signal is sent from the CPU 4 to the four IC chips 5. Note that, without providing the ports having the fixed logic levels such as the ports (1) and (2), the CPU 4 may send the identification information to each of the four IC chips 5 and store it in the identification information storage 9 when the four IC chips 5 are reset.

In the general purpose input/output port 12 of the IC chip 5a, the ports (1) and (2) are respectively fixed at L-level. The identification information setter 10 of the IC chip 5a causes the identification information storage 9 of the IC chip 5a to store an L-level signal "0" input to the port (1) and an L-level signal "0" input to the port (2) as the identification information.

In a general purpose input/output port 12 of the IC chip 5b, a port (1) is fixed at H level and a port (2) is fixed at L level. An identification information setter 10 of the IC chip 5b causes an identification information storage 9 to store an H-level signal "1" input to the port (1) and an L-level signal "0" input to the port (2) as identification information when the four IC chips 5 are reset.

In a general purpose input/output port 12 of the IC chip 5c, a port (1) is fixed at L level and a port (2) is fixed at H level. An identification information setter 10 of the IC chip 5c causes an identification information storage 9 to store an L-level signal "0" input to the port (1) and an H-level signal "0" input to the port (2) as identification information when the four IC chips 5 are reset.

In a general purpose input/output port 12 of the IC chip 5d, each of ports (1) and (2) is fixed at H level. An identification information setter 10 of the IC chip 5d causes an identification information storage 9 to store an H-level signal "1" input to the port (1) and an H-level signal "1" input to the port (2) as identification information when the four IC chips 5 are reset.

FIGS. 4A-4D are circuit diagrams showing examples in which the ports (1) and (2) are fixed at predetermined logic levels. Switches S1, S2, S4 and S5 are, for example, transistors, and an L-level signal flows when they are turned off, whereas an H-level signal flows when they are turned on. Switches S3, S6, S7 and S8 are, for example, transistors, and an H-level signal flows when they are turned off, whereas an L-level signal flows when they are turned on.

Figure 4A:
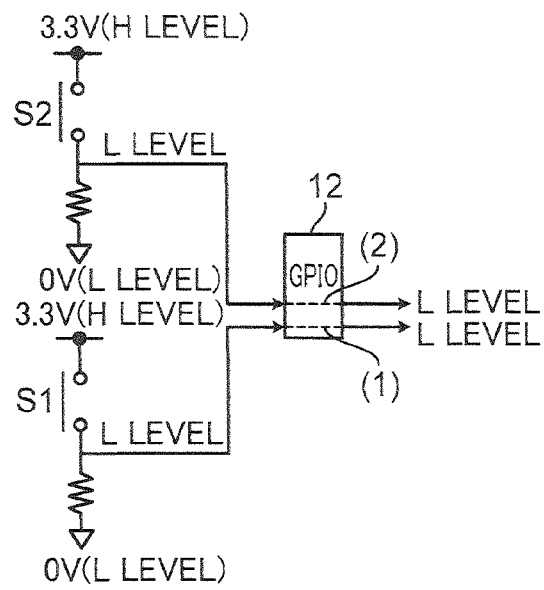
FIGS. 4A-4D are circuit diagrams showing examples of fixing ports (1) and (2) of a general purpose input/output port at predetermined logic levels.

A combination of the switches shown in FIG. 4A is applied to the IC chip 5a. The switch S1 is connected to the port (1) and the switch S2 is connected to the port (2). When the switch S1 is off, the signal input to the port (1) is fixed at L level. When the switch S2 is off, the signal input to the port (2) is fixed at L level.

Figure 4B:
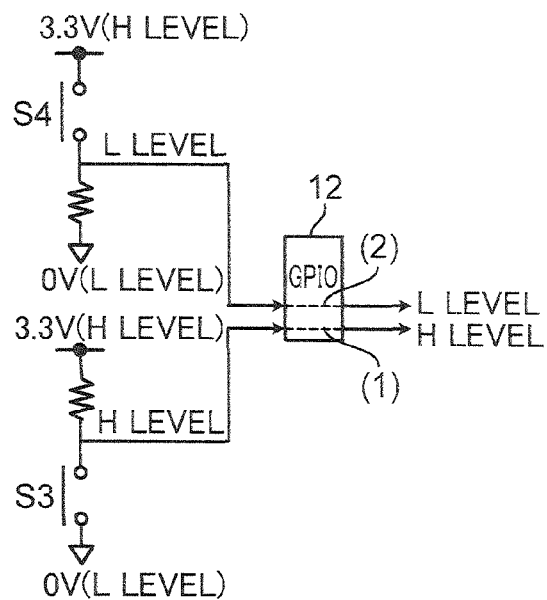

A combination of the switches shown in FIG. 4B is applied to the IC chip 5b. The switch S3 is connected to the port (1) and the switch S4 is connected to the port (2). When the switch S3 is off, the signal input to the port (1) is fixed at H level. When the switch S4 is off, the signal input to the port (2) is fixed at L level.

Figure 4C:
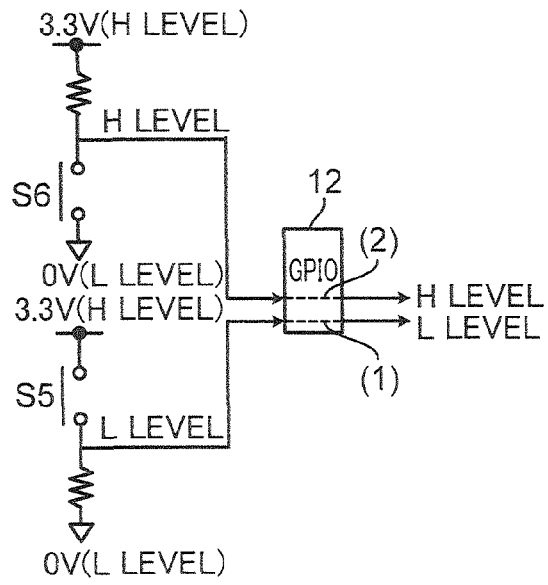

A combination of the switches shown in FIG. 4C is applied to the IC chip 5c. The switch S5 is connected to the port (1) and the switch S6 is connected to the port (2). When the switch S5 is off, the signal input to the port (1) is fixed at L level. When the switch S6 is off, the signal input to the port (2) is fixed at H level.

Figure 4D:
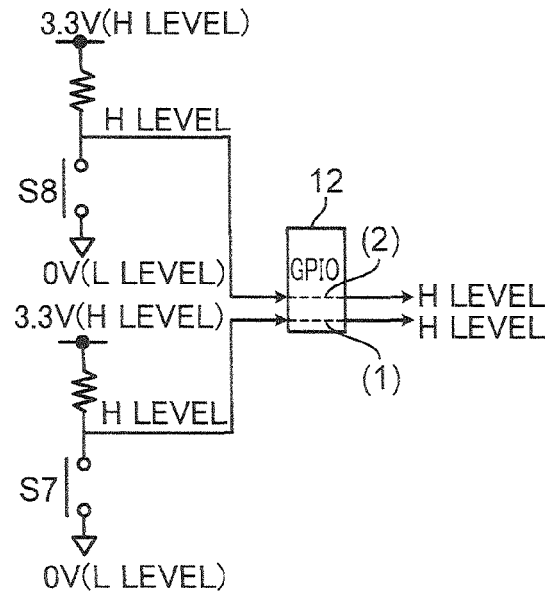

A combination of the switches shown in FIG. 4D is applied to the IC chip 5d. The switch S7 is connected to the port (1) and the switch S8 is connected to the port (2). When the switch S7 is off, the signal input to the port (1) is fixed at H level. When the switch S8 is off, the signal input to the port (2) is fixed at H level.

As described above, according to this embodiment, the ports (1) and (2) of the general purpose input/output port 12 are used as ports (signal terminals) fixed at the predetermined logic levels. The CPU 4 allots the ports (1) and (2) for the input or output of signals different from the input of identification signals (for the input of switch signals generated when the switches are depressed) except when the four IC chips 5 are reset. Thus, the ports (1) and (2) of the four IC chips 5 can be used for other purposes except when the four IC chips 5 are reset.

FIG. 5 is a time chart showing the four operating clocks 0, 1, 2 and 3 generated by the plural clock generator 13. H level and L level of these operating clocks may be reversed. Taking the IC chip 5a as an example, the generation of the four operating clocks 0, 1, 2 and 3 is described with reference to FIGS. 4 and 5. A reset signal from the CPU 4 is input to the IC chip 5a by way of the input/output port 11 of the IC chip 5a. This causes L-level signals input to the ports (1) and (2) of the IC chip 5a to be stored as the identification information (00) in the identification information storage 9 of the IC chip 5a and the reference clock from the CPU 4 to be input to the IC chip 5a by way of the input/output port 11 of the IC chip 5a.

The clock multiplier 7 generates a multiplication clock by multiplying the frequency of the reference clock, using the reference clock. Since this enables a relatively low frequency to be selected as the frequency of the reference clock, a level of unnecessary radiation from a wiring for transmitting the reference clock to the IC chip 5a can be suppressed.

The operating clock generator 8 includes a counter (not shown) for counting the multiplication clock and generates the operating clocks by switching a signal level at a predetermined interval in a count value of the counter. More specifically, the plural clock generator 13 generates the operating clock 0 which rises (falls) at a count number of 1 and whose signal level is switched every four counts, the operating clock 1 which rises (falls) at a count number of 2 and whose signal level is switched every four counts, the operating clock 2 which rises (falls) at a count number of 3 and whose signal level is switched every four counts and the operating clock 3 which rises (falls) at a count number of 4 and whose signal level is switched every four counts. Thus, the four operating clocks 0 to 3 generated by the plural clock generator 13 have frequencies lower than that of the multiplication clock, synchronize with the multiplication clock and become clocks having the same frequency and mutually different phases.

The other IC chips 5b, 5c and 5d similarly generate operating clocks 0 to 3.

The identification information (00) is stored in the identification information storage 9 of the IC chip 5a. Thus, the operating clock 0 is selected by the operating clock selector 14 and output from the operating clock generator 8. This operating clock 0 is utilized as a clock for operating circuits provided in the IC chip 5a. These circuits include a circuit for controlling the sheet conveying motor 6a.

The identification information (01) is stored in the identification information storage 9 of the IC chip 5b. Thus, the operating clock 1 is selected by the operating clock selector 14 and output from the operating clock generator 8. This operating clock 1 is utilized as a clock for operating circuits provided in the IC chip 5b. These circuits include a circuit for controlling the sheet conveying motor 6b.

The identification information (10) is stored in the identification information storage 9 of the IC chip 5c. Thus, the operating clock 2 is selected by the operating clock selector 14 and output from the operating clock generator 8. This operating clock 2 is utilized as a clock for operating circuits provided in the IC chip 5c. These circuits include a circuit for controlling the sheet conveying motor 6c.

The identification information (11) is stored in the identification information storage 9 of the IC chip 5d. Thus, the operating clock 3 is selected by the operating clock selector 14 and output from the operating clock generator 8. This operating clock 3 is utilized as a clock for operating circuits provided in the IC chip 5d. These circuits include a circuit for controlling the sheet conveying motor 6d.

Main effects of this embodiment are described. In this embodiment, in each IC chip 5, the multiplication clock having a frequency higher than that of the reference clock is generated using the reference clock input to the IC chip 5 from the outside of the IC chip 5. Since this enables a relatively low frequency to be selected as the frequency of the reference clock, the level of unnecessary radiation from the wiring for transmitting the reference clock to each IC chip 5 can be suppressed.

The operating clock having a frequency higher than that of the reference clock and lower than that of the multiplication clock is generated using the multiplication clock in this embodiment. At that time, the operating clock is generated in synchronization with the timing allotted to the identification information of each IC chip 5. In this way, the operating clocks having mutually different phases are generated in the respective IC chips 5. Specifically, the operating clock generator 8 of the IC chip 5a outputs the operating clock 0, the operating clock generator 8 of the IC chip 5b outputs the operating clock 1, the operating clock generator 8 of the IC chip 5c outputs the operating clock 2 and the operating clock generator 8 of the IC chip 5d outputs the operating clock 3.

Accordingly, since the generation timings of the operating clocks of the respective IC chips 5 can be made different according to this embodiment, the level of unnecessary radiation can be suppressed in all the four IC chips 5.

Figure 6A:
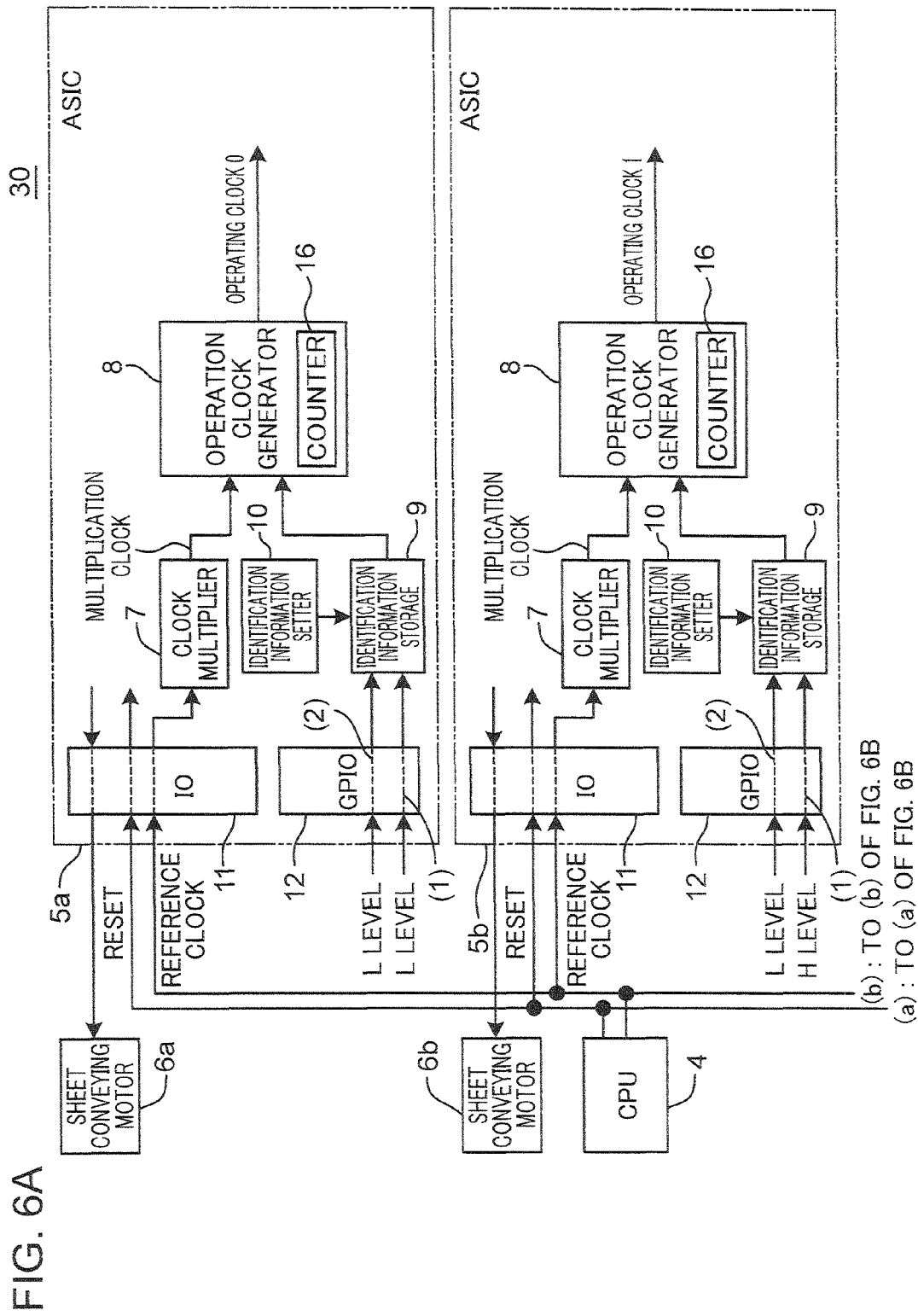
FIG. 6A is a block diagram showing the configuration of a modification of the information processing device provided in the image forming apparatus according to the embodiment.
Figure 6B:
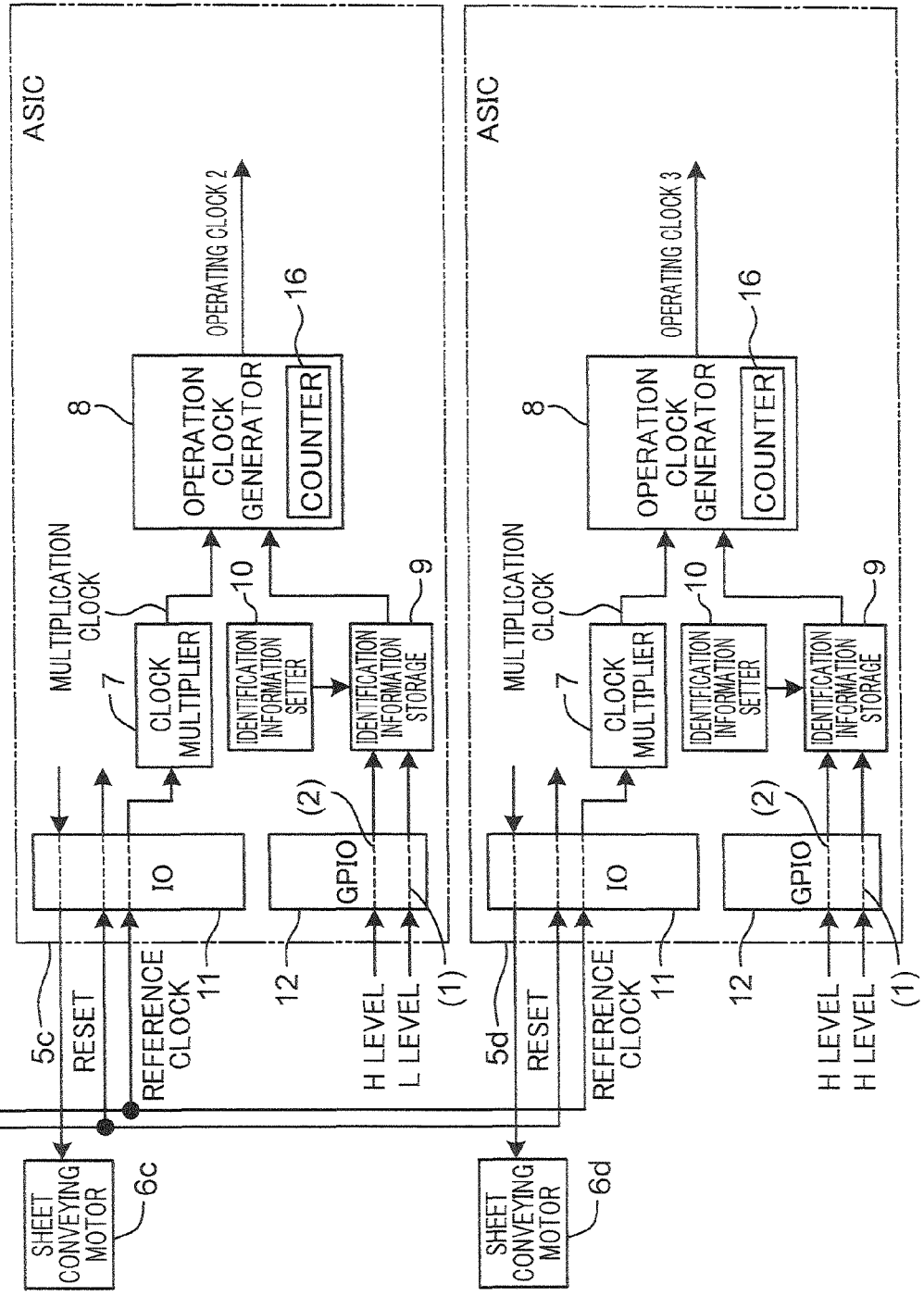
FIG. 6B is a block diagram showing the configuration of the modification of the information processing device provided in the image forming apparatus according to the embodiment.

A modification of this embodiment is described. FIGS. 6A and 6B are block diagrams showing the configuration of a modification of the information processing device provided in the image forming apparatus 1 according to this embodiment. Paths for sending a reset signal of FIGS. 6A and 6B are connected at a position (a). Paths for sending a reference clock signal of FIGS. 6B and 6A are connected at a position (b). In FIGS. 6A and 6B, the same elements as those of the information processing device 3 shown in FIGS. 3A and 3B are denoted by the same reference signs. An information processing device 30 according to the modification is described, centering on points of difference from the information processing device 3 shown in FIGS. 3A and 3B.

Operating clock generators 8 of the information processing device 30 according to the modification each include a counter 16 for counting a multiplication clock and generate an operating clock by switching a signal level at a predetermined interval based on a count value of the counter 16, and the count value, at which the generation of the operating clock is started, is made different according to identification information stored in an identification information storage of each IC chip 5.

An operation of generating the operating clocks by the information processing device 30 according to the modification is specifically described using FIG. 5. The counter 16 of the operating clock generator 8 counts the number of multiplication clocks. If identification information (00) is stored in the identification information storage 9, the operating clock generator 8 generates an operating clock 0 which rises (falls) at a count value of 1 and whose signal level is switched every four counts, but does not generate any other operating clock.

If identification information (01) is stored in the identification information storage 9, the operating clock generator 8 generates an operating clock 1 which rises (falls) at a count value of 2 and whose signal level is switched every four counts, but does not generate any other operating clock.

If identification information (10) is stored in the identification information storage 9, the operating clock generator 8 generates an operating clock 2 which rises (falls) at a count value of 3 and whose signal level is switched every four counts, but does not generate any other operating clock.

If identification information (11) is stored in the identification information storage 9, the operating clock generator 8 generates an operating clock 3 which rises (falls) at a count value of 4 and whose signal level is switched every four counts, but does not generate any other operating clock.

Accordingly, as shown in FIGS. 6A and 6B, the operating clock generator 8 of the IC chip 5a generates the operating clock 0, the operating clock generator 8 of the IC chip 5b generates the operating clock 1, the operating clock generator 8 of the IC chip 5c generates the operating clock 2 and the operating clock generator 8 of the IC chip 5d generates the operating clock 3.

According to the modification, in each IC chip 5, the operating clock can be generated without generating four operating clocks 0, 1, 2 and 3 at timings different from each other. Thus, power consumption when the operating clocks are generated can be reduced. Further, the operating clock selectors 14 shown in FIGS. 3A and 3B need not be provided.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

What is claimed is:

1. An information processing device comprising a plurality of semiconductor integrated circuits, each of the plurality of semiconductor integrated circuits includes:
an identification information storage for storing identification information of the semiconductor integrated circuit;
an intermediate clock generator for generating an intermediate clock having a frequency higher than that of a reference clock using the reference clock input to the semiconductor integrated circuit from the outside of the semiconductor integrated circuit;
an operating clock generator for generating an operating clock having a frequency higher than that of the reference clock and lower than that of the intermediate clock in synchronization with a timing allotted according to the identification information stored in the identification information storage, using the intermediate clock;
a signal terminal fixed at a predetermined logic level; and
an identification information setter for causing the identification information storage to store a signal input to the signal terminal as the identification information when the plurality of semiconductor integrated circuits are reset, the plurality of semiconductor integrated circuits being distinguished from each other according to the identification information;
wherein the operating clock generators provided in the plurality of semiconductor integrated circuits generate the operating clocks at timings different from each other.

2. A semiconductor integrated circuit according to claim 1, wherein the operating clock generator includes:
a plural clock generator for generating a plurality of operating clocks at timings different from each other; and
an operating clock selector for selecting the operating clock allotted to the identification information stored in the identification information storage out of the plurality of operating clocks generated by the plural clock generator.

3. A semiconductor integrated circuit according to claim 1, wherein:
the operating clock generator includes a counter for counting the intermediate clock and generates the operating clock by switching a signal level at a predetermined interval in a count value of the counter, and the count value, at which the generation of the operating clock is started, is made different according to the identification information stored in the identification information storage.

4. An information processing device according to claim 1, wherein:
the operating clock generators provided in the plurality of semiconductor integrated circuits generate the operating clocks having the same frequency and mutually different phases.

5. An information processing device according to claim 1, comprising:
a control unit for allotting the signal terminal for the input or output of a signal different from the input of the identification information except when the plurality of semiconductor integrated circuits are reset.

6. An image forming apparatus, comprising:
the information processing device of claim 1; and
a plurality of loads used to control the image forming apparatus, respectively connected to the plurality of semiconductor integrated circuits and having the same configuration.

7. An image forming apparatus according to claim 6, wherein the plurality of semiconductor integrated circuits are IC chips having the same number of terminals and the same configuration.

8. An image forming apparatus according to claim 6, further comprising:
a sheet conveyance path;
a plurality of sheet conveying rollers arranged in the sheet conveyance path; and
a plurality of sheet conveying motors for respectively rotating the plurality of sheet conveying rollers and conveying a sheet along the sheet conveyance path;

wherein the plurality of loads are the plurality of sheet conveying motors.

9. An image forming apparatus, comprising:

an information processing device including a semiconductor integrated circuit capable of generating an operating clock, the semiconductor integrated circuit comprising:

an identification information storage for storing identification information of the semiconductor integrated circuit;

an intermediate clock generator for generating an intermediate clock having a frequency higher than that of a reference clock using the reference clock input to the semiconductor integrated circuit from outside the semiconductor integrated circuit; and an operating clock generator for generating the operating clock having a frequency higher than that of the reference clock and lower than that of the intermediate clock in synchronization with a timing allotted according to the identification information stored in the identification information storage, using the intermediate clock, the information processing device comprising:

a plurality of semiconductor integrated circuits distinguished from each other according to the identification information;

wherein the operating clock generators provided in the plurality of semiconductor integrated circuits generate the operating clocks at timings different from each other, the image forming apparatus further comprising:

a plurality of loads used to control the image forming apparatus, respectively connected to the plurality of semiconductor integrated circuits and having the same configuration;

a sheet conveyance path;

a plurality of sheet conveying rollers arranged in the sheet conveyance path; and a plurality of sheet conveying motors for respectively rotating the plurality of sheet conveying rollers and conveying a sheet along the sheet conveyance path;

wherein the plurality of loads are the plurality of sheet conveying motors.

* * * * *